United States Patent [19]
Berger

[11] Patent Number: 5,831,916
[45] Date of Patent: Nov. 3, 1998

[54] REDUNDANT CIRCUITS AND METHODS THEREFOR

[75] Inventor: Christian A. Berger, South Burlington, Vt.

[73] Assignee: Siemens Aktiengesellschaft, Munich, Germany

[21] Appl. No.: 879,726

[22] Filed: Jun. 20, 1997

[51] Int. Cl.[6] .................................................. G11C 7/00
[52] U.S. Cl. ...................................... 365/200; 365/225.7
[58] Field of Search .............................. 365/200, 230.08, 365/225.7, 189.05

[56] References Cited

U.S. PATENT DOCUMENTS 5,596,535  1/1997  Mushya et al. .......................... 365/200
5,621,691  4/1997  Park ........................................ 365/200

Primary Examiner—David C. Nelms
Assistant Examiner—Vu A. Le
Attorney, Agent, or Firm—Dexter K. Chin

[57] ABSTRACT

A method for replacing defective elements of a memory array. The method includes forming a first redundant circuit, which in turn includes forming a first plurality of address fuses. The first plurality of address fuses are configured to specify, when set, an address of one of the defective elements. The method further includes forming a first plurality of address latches, respective ones of the first plurality address latches being coupled with respective ones of the first plurality of address fuses. There is further included forming a first redundant element. Additionally, the method includes forming a first decoding logic circuit. The first decoding logic is coupled to the first plurality of address latches and the redundant element. The first decoding logic circuit is configured to ascertain during operation of the memory array whether a bit pattern stored in the first plurality of address fuses differs from a first predefined value and to place the first redundant element in a replacement mode if the bit pattern differs from the predefined value. The replacement mode enables the first redundant element to be used in place of the one of the defective elements during operation.

20 Claims, 3 Drawing Sheets

REDUNDANT CIRCUITS AND METHODS THEREFOR

BACKGROUND OF THE INVENTION

The present relates to the design and manufacture of semiconductor devices. More particularly, the present invention relates to improved techniques for increasing circuit density in a memory circuit.

In a memory circuit, e.g., a dynamic random access memory or a field programmable logic device, the memory cells are typically arranged in rows and columns for addressing purposes. By way of example, a typical dynamic random access memory (DRAM) chip may have up to 64 million cells, which may be arranged in rows and columns to be addressed by word lines and bit lines. Dynamic random access memory circuits and designs therefor are well known in the art and will not be discussed in detail here for brevity sake.

During the manufacture of a typical DRAM chip, one or more of the millions of cells in the main array may be found to be defective. Instead of discarding the entire chip, designers in the past have provided redundant cells, which may be substituted in for the defective cells, thereby bypassing the defective cells and allowing the memory circuit to be used as if there were no defects.

If a cell in the main memory array is found to be defective during manufacturing, the entire row or column that contains the defective cell is usually replaced by a redundant row or column. For ease of reference, the entire row or column of cells is referred to herein as an element. Also for ease of understanding, the discussion herein will be made with reference to rows and the replacement thereof although it should be borne in mind that the issues discussed herein apply equally well to columns and their replacement.

When a redundant element is used to replace a defective element in the main array, the prior art technique of replacement involves setting an enable fuse of the redundant circuit during manufacturing to indicate that the redundant element is to be employed instead of one of the main array elements. The address of the defective main array element that is replaced by that redundant element is specified, also during manufacture, by setting address fuses of that redundant circuit. During run time, the values of the enable fuse and address fuses are loaded into an enable latch and address latches respectively. If the enable latch contains the value signifying that the redundant element should be used, that redundant element will be used in place of the defective main array element whose address is specified by the address latches.

To further elaborate, FIG. 1 illustrates a highly simplified DRAM cell 100 having a main array 102. Main array 102 is shown having only 4 rows or elements (0–3) to facilitate ease of discussion although a main array in reality typically has many more elements. There is also shown a redundant row or element 104, which may be used to replace any of elements 0–3.

To replace any of elements 0–3, redundant element 104 is associated with two address bits A1 and A0. The values of the address bits specify to a decoding logic circuit which main array element that redundant element 104 replaces. FIG. 2 illustrates the redundant circuitry employed in the prior art to specify the replacement address for redundant element 104. As shown in FIG. 2, redundant circuit 210 includes a redundant element 104, which is coupled to a decoding logic 202. Decoding logic 202 is responsible for ascertaining, based on the enable and address fuses set during manufacturing, whether redundant element 104 should be used to replace a defective main array element and if so, which defective main array element.

In FIG. 2, the enable fuse is shown as enable fuse EF, and the two address fuses for the example of FIG. 1 are shown as address fuses AF1 and AF0. Assume for the sake of discussion that main array element #2 was found to be defective during quality control of DRAM cell 100. In this case, enable fuse EF would be set to indicate that redundant array element 104 should be substituted in. Address fuses AF1 would be set while address fuse AF0 is not set to form the bit pattern "10" for specifying that redundant element 104 would be used to replace main array element 2.

During power up, i.e., during run time of the DRAM cell, the value in enable fuse EF is loaded into enable latch EL of FIG. 2. In this case, the value "1" would be loaded into enable latch EL. The values in address fuses AF1 and AF0 are also loaded into address latches AL1 and AL0 respectively, causing address latch AL1 to store the value "1" and address latch AL0 to store the value "0." Latches are employed since they can be read faster than fuses during run time, thereby optimizing the operating speed of the DRAM cell. By examining enable latch EL, decoding logic 202 can ascertain that redundant element 104 should be used to replace a defective array element. By examining address latches AL1 and AL0, decoding logic 202 can ascertain that redundant element 104 is to be used to replace defective array element #2.

While the prior art technique described in connection with FIG. 2 works adequately to replace defective main array elements, there are disadvantages. By way of example, as DRAM cells increase in capacity, there exists a need to put a greater number of main array memory elements and/or redundant elements into a chip of a given size. In the prior art, each redundant element requires the provision of an enable fuse with its redundant circuit to indicate whether that redundant element should be used during run time, as discussed earlier. If a large number of redundant elements are provided on a DRAM chip (to potentially replace a high number of defective main array elements), the large number of enable fuses takes up a nontrivial area on the DRAM chip, thereby limiting the number of main array elements and/or redundant elements that can be provided per chip.

Additionally, the prior art requires that each redundant element employs an enable latch in conjunction with the enable fuse. Again, if a large number of redundant elements are provided on a DRAM chip, the large number of enable latches also takes up a nontrivial area on the DRAM chip, thereby further limiting the number of main array elements and/or redundant elements that can be provided per chip.

In view of the foregoing, there are desired improved redundant circuit designs that advantageously reduce the area required for their implementation, thereby permitting a greater number of main array elements and/or redundant elements to be placed on a given chip.

SUMMARY OF THE INVENTION

The invention relates, in one embodiment, to the replacement of replacing defective elements of a memory array. The invention includes forming a first redundant circuit, which in turn includes forming a first plurality of address fuses. The first plurality of address fuses are configured to specify, when set, an address of one of the defective elements. The invention further includes forming a first plurality of address latches, respective ones of the first plurality address latches being coupled with respective ones of the first plurality of address fuses.

There is further included forming a first redundant element. Additionally, the method includes forming a first decoding logic circuit. The first decoding logic is coupled to the first plurality of address latches and the redundant element. The first decoding logic circuit is configured to ascertain during operation of the memory array whether a bit pattern stored in the first plurality of address fuses differs from a first predefined value and to place the first redundant element in a replacement mode if the bit pattern differs from the predefined value. The replacement mode enables the first redundant element to be used in place of the one of the defective elements during operation.

In another embodiment, the invention relates to a redundant circuit having a redundant element. The redundant element is configured to replace a defective memory array element. The redundant circuit includes a first plurality of address fuses that are configured to specify, when set, an address of the defective memory array element. The redundant circuit further includes a first plurality of address latches, respective ones of the first plurality of address latches being coupled to respective ones of the first plurality of address fuses. There is also included a first decoding logic circuit coupled to the first plurality of address latches and the redundant element. The first decoding logic circuit is configured to ascertain whether the redundant element is in an inactive mode or a replacement mode. The redundant element is ascertained by the first decoding logic circuit to be in the inactive mode if the first plurality of address fuses store a value that is equal to a predefined value. The redundant element is ascertained by the first decoding logic circuit to be in the replacement mode if the value stored in the first plurality of address fuses is different from the predefined value, wherein the first decoding logic circuit so ascertains without use of an enable fuse.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE INVENTION

Figure 1:
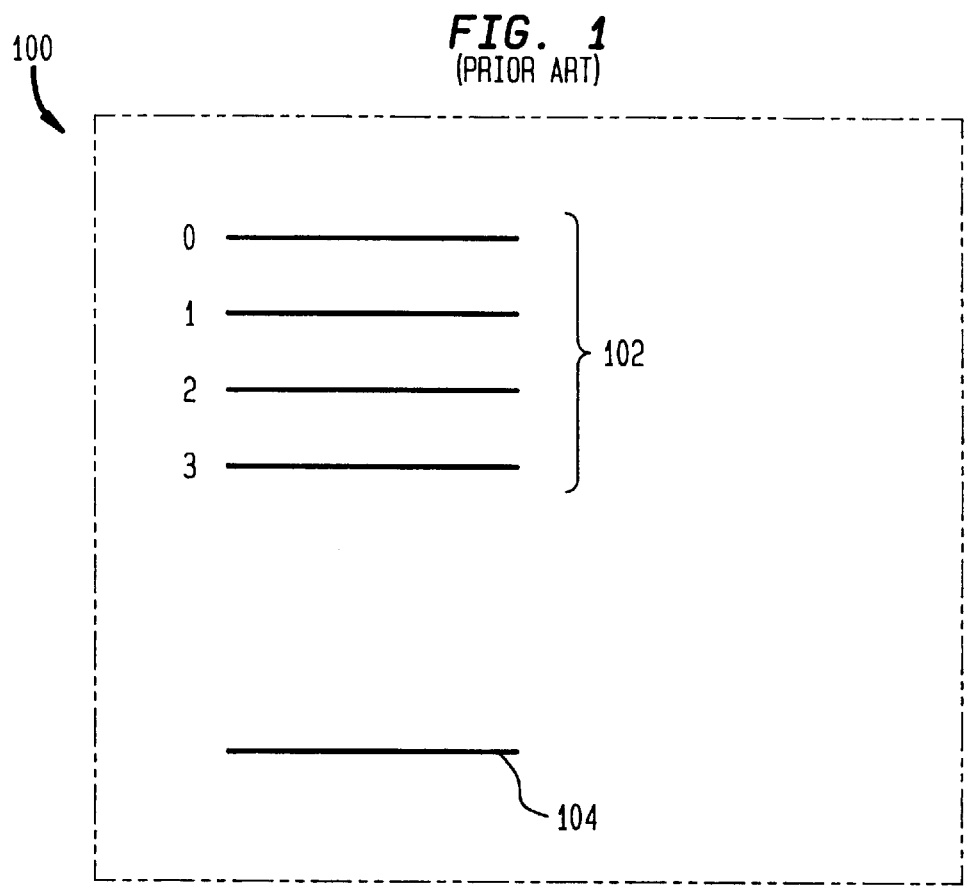
FIG. 1 illustrates a highly simplified DRAM cell having a main array to facilitate discussion.

The present invention will now be described in detail with reference to illustrative embodiments as depicted in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

For purpose of discussion, the invention is described in the context of a memory circuit such as a random access memory (RAM), including dynamic RAM (DRAM) and synchronous DRAM (SDRAM). However, the invention has other applications including logic devices. To facilitate ease of understanding, the memory array has been simplified to include four elements. Of course, an actual memory array comprises significantly more elements. To improve efficiency, the array is conceptually divided into subgroups comprising a smaller, manageable number of elements. Generally, a plurality of redundant elements and associated circuitry are provided, each being assigned to replace a respective subgroup of elements within the main array.

In accordance with one embodiment of the present invention, there is provided a redundant circuit design that advantageously eliminates the need for the enable fuse. A redundant circuit is associated with a redundant element and is assigned a predefined value. During manufacturing, if the redundant element associated with that redundant circuit is in the inactive mode (i.e., it will not be used to replace a defective main array element), the address fuses associated with that redundant circuit will store a value that is equal to the predefined value. On the other hand, if the redundant element is in the replacement mode, the address fuses of its associated redundant circuit will be set to the address of the defective main array element that it replaces.

When a plurality of redundant elements and associated circuitry are employed, the perdefined value stored in the address fuses of respective redundant elements is not important. Further, it is also not important that the predefined value stored in the address fuses be the same for all the redundant elements. The predefined value can either be identical, not identical, or some identical and some not identical.

During operation, the values in the address fuses are examined to ascertain whether they are different from the predefined value. If they are different, the decoding logic of the redundant circuit sets an enable latch to signify that the associated redundant element is to be used during operation to replace one of the main array elements, which has been found to be defective. The address of the defective main array element, which address is stored in the address fuses during manufacturing, is then loaded into the address latches for use during operation.

In another embodiment, a redundant circuit design that advantageously eliminates the need for both the enable fuse and the enable latch is provided. A redundant circuit is associated with a redundant element. Like before, the redundant circuit is assigned a predefined value. During manufacturing, if the redundant element associated with this redundant circuit is in the inactive mode (i.e., it will not be used to replace a defective main array element), the address fuses associated with that redundant element will store a value that is equal to the predefined value. On the other hand, if the redundant element is in the replacement mode, the address fuses of its associated redundant circuit will be set to the address of the defective main array element that it replaces.

During operation, the values in the address fuses are examined to ascertain whether they are different from the predefined value. If it is different, the decoding logic of the redundant circuit understands that the associated redundant element is to be used during operation to replace one of the main array elements, which has been found to be defective. The address of the defective main array element, which is stored in the address fuses during manufacturing, is then loaded into the address latches for use during operation.

Note that since one of the main array element address is used to indicate whether the redundant element is in the inactive mode or the replacement mode (i.e., the address of the predefined value), there exists the possibility that a given redundant element is incapable of providing replacement for the main array element whose address matches the predefined value. To resolve this, there is provided, in accordance with one aspect of the present invention, overlapping redundant circuit coverage to ensure that all main array elements are replaceable. In accordance with this aspect of the present invention, each memory array is preferably provided with at least two redundant elements (and two associated redundant circuits). The two associated redundant circuits preferably have different predefined values. By way of example, if redundant circuit #1 is associated with predefined value 3 and is therefore incapable of providing replacement for a main array element #3, redundant circuit #2 is preferably associated with any predefined value other than 3 (e.g., 2) and can therefore provide replacement coverage should main array element #3 is found to be defective during manufacturing.

Alternatively, at least two redundant circuits are provided for the memory array. The coverage of the redundant circuits overlaps at least two elements. For example, assume the main memory array comprises six elements (0–5) and the redundant circuit replaces 1 of 4 elements. In such case, one redundant circuit covers elements 0–3 in the main array and the other covers elements 2–5. Further, assume that the predefined value for the first redundant circuit is 3 and the second redundant is 0. The predefined value 3 in the first redundant circuit corresponds to main array element 2 while the predefined value 0 in the second redundant circuit corresponds to main array element 3. As such, the first redundant circuit cannot replace element 2 and the second redundant circuit cannot replace element 3. However, the second redundant circuit can replace element 2 (which the first redundant circuit cannot) and the first redundant circuit can replace element 3. Thus, overlapping coverage enables full redundancy coverage of the whole array.

Figure 3:
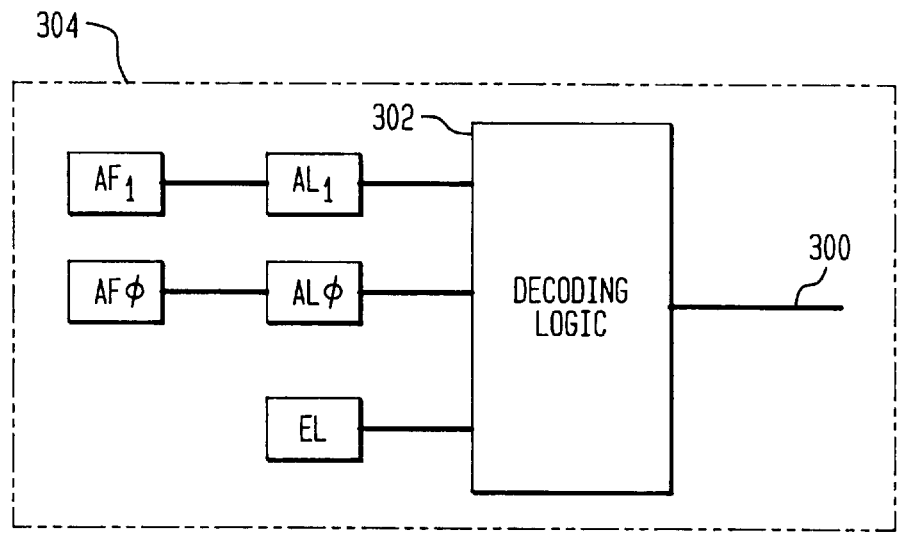
FIG. 3 illustrates, in accordance with one embodiment of the invention, an improved redundant circuit wherein the enable fuse is no longer required.

The features and advantages of the present invention may be better understood with the figures hereinbelow. FIG. 3 illustrates, in accordance with one embodiment of the invention, an improved redundant circuit wherein the enable fuse is no longer required. In FIG. 3, there is shown an improved redundant circuit 304, which includes redundant element 300 for replacing one of main array elements found to be defective during manufacturing. Redundant element 300 is substantially similar to redundant element 104 of prior art FIG. 1.

Redundant element 300 is shown responds to decoding logic 302 of redundant circuit 304. Decoding logic 302 represents the circuit responsible to determining during operation whether its associated redundant element 300 is in the inactive mode (i.e., not used to replace any defective main array element) or in the replacement mode (i.e., will be employed during operation of the memory array to replace a defective main array element). If decoding logic 302 determines that redundant element 300 is in the replacement mode, it is also responsible for determining during operation the address of the defective main array element for which redundant element 300 substitutes.

Decoding logic 302 is shown coupled to a plurality of address latches AL1 and AL0. Address latches AL1 and AL0 are in turn coupled to address fuses AF1 and AF0 respectively as shown. For ease of explanation, it is assumed herein that the main array element has only four elements (rows or columns, depending on whether redundant element 300 is a row or a column) although, as noted earlier, a typically main array usually has many more elements. Also for ease of explanation, the redundant element is provided with sufficient address bits (e.g., two address bits) to address the entire memory space of the main array. It should be appreciated by those skilled that this is not a requirement, and some redundant element implementations may be provided with only sufficient address bits to address the subset of memory space to which it is assigned for replacement purpose. The invention disclosed herein also applies to these implementations as well.

In accordance with one aspect of the present invention, redundant circuit 304 (which is associated with redundant element 300) is assigned a predefined value. To facilitate discussion, this predefined value is arbitrarily given the value of 3 although it could be any predefined value that can be represented by the bit pattern stored in the address fuses. As such, address fuses AF1 and AF0 will store a default bit pattern of 3. When address fuses AF1 and AF0 store the predefined value, associated redundant element 300 is understood to be in the inactive mode, and enable latch EL is not set.

If the main array element #2, for example, is found to be defective during manufacturing and redundant element 300 is to be used for the replacement thereof, the values in address fuses AF1 and AF0 will be set to the value of "2" (i.e., AF1 and AF0 will be set to "1" and "0" respectively in accordance with binary logic). If the address fuses AF1 and AF0 is found during operation to store any value other than the predefined value (e.g., 3 in this example), associated redundant element 300 is understood by decoding logic 302 to be in the replacement mode. Accordingly, decoding logic 302 (or another suitable circuit) will set enable latch EL to signify that redundant element 300 will be used henceforth during operation as the replacement element for defective main array element 2 (the value "2" is stored as a bit pattern in address fuses AF1 and AF0) in the manner described earlier. Typically, the values in address fuses AF1 and AF0 are loaded into respective address latches AL1 and AL0 upon startup to allow the decoding logic 302 to determine the mode of operation (i.e., the inactive mode or the replacement mode) of redundant element 300. Alternatively, it is possible ascertain the mode of operation of redundant element directly from the values stored in the address fuses AF1 and AF0.

Figure 4:
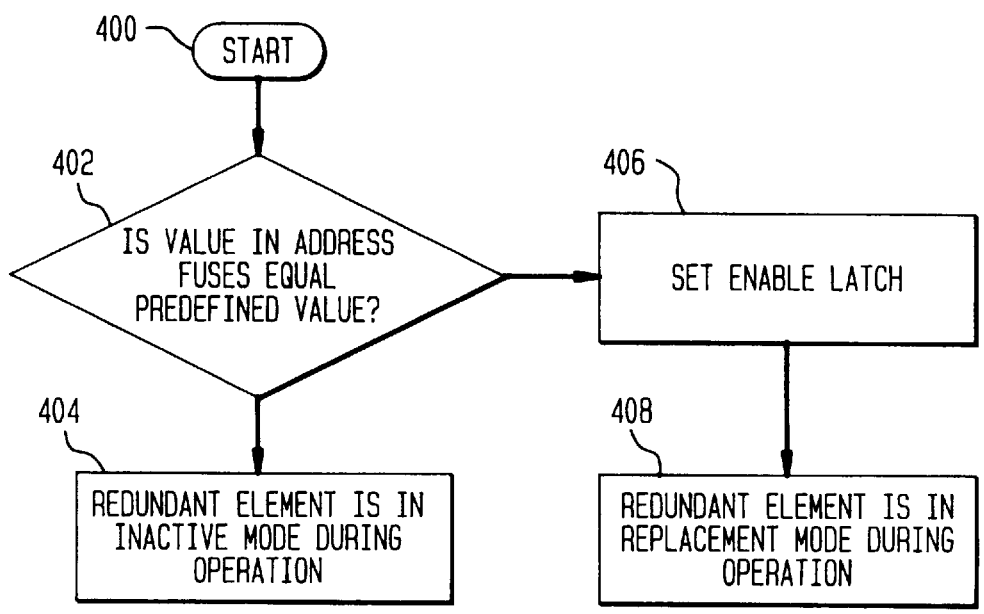
FIG. 4 illustrates, in accordance with one embodiment of the invention, the steps taken by the decoding logic in placing the redundant element of FIG. 3 into the replacement mode.

FIG. 4 illustrates, in accordance with one embodiment of the invention, the steps taken by decoding logic 302 in placing redundant element 300 into the replacement mode. In step 402, decoding logic 302 compares the value stored in the address fuses during manufacturing with the predefined value. Typically but not necessarily, the value stored in the address fuses is first loaded into the respective address latches prior to the comparison. If they match, the redundant element associated with decoding logic 302 is understood to be in the inactive mode during operation (step 404), and there is no need to set the enable fuse.

On the other hand, if the value stored in the address fuses during manufacturing differs from the predefined value, enable latch EL is then set (step 406) to signify that redundant element 300 is to be in the replacement mode during operation. Thereafter, redundant element 300 is used in the replacement mode during operation (step 408). The address stored in the address fuses (and loaded into the address latches) specifies which main array element redundant element 300 substitutes during operation.

Figure 2:
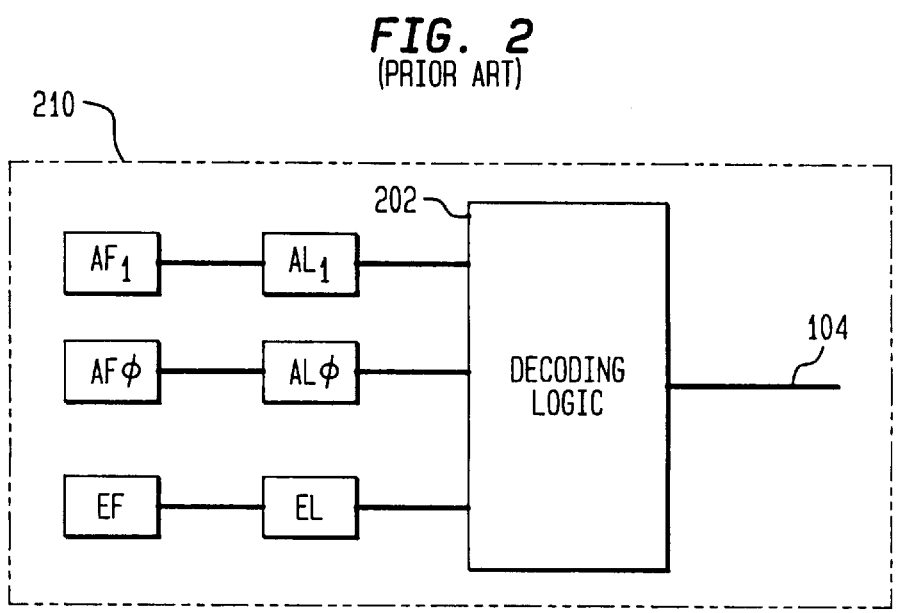
FIG. 2 illustrates the redundant circuitry employed in the prior art to specify the replacement address for a redundant element.
Figure 5:
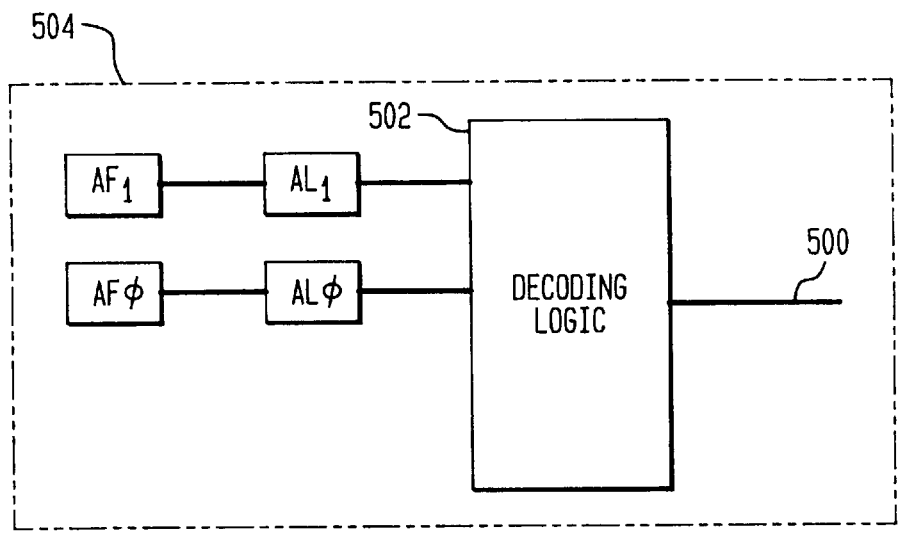
FIG. 5 illustrates another embodiment of the invention wherein both the enable fuse EF and the enable latch EL are advantageously eliminated.

FIG. 5 illustrates another embodiment of the invention wherein both the enable fuse EF and the enable latch EL are advantageously eliminated. In FIG. 5, there is shown another improved redundant circuit 504, which includes redundant element 500 for replacing one defective main array element. Redundant element 500 is shown coupled to decoding logic 502 of associated redundant circuit 504. However, the enable latch EL of the embodiment of FIG. 3 and prior art FIG. 2 has been eliminated. Decoding logic 502 is shown coupled to address latches AL1 and AL0, which are in turn coupled to address fuses AF1 and AF0 respectively. Again, it is assumed for ease of explanation that the memory array only has four elements although, as stated earlier, a memory array may have any number of array elements.

As in the case of FIG. 3, redundant circuit 504 (which is associated with redundant element 500) is assigned a predefined value. To facilitate discussion, this predefined value is arbitrarily given the value of 2 although it could be any predefined value that can be represented by the bit pattern stored in the address fuses. As such, address fuses AF1 and AF0 will store a default bit pattern of 2. When address fuses AF1 and AF0 store the predefined value, associated redundant element 300 is understood by decoding logic 502 to be in the inactive mode during operation and will not be employed for replacement purpose.

If the main array element #3, for example, is found to be defective during manufacturing and redundant element 500 is to be used for the replacement thereof, the values in address fuses AF1 and AF0 will be set to the value of "3" (i.e., AF1 and AF0 will both be set to "1" in accordance with binary logic). If the address fuses AF1 and AF0 is found during operation to store any value other than the predefined value (e.g., 2 in this example), associated redundant element 500 is understood by decoding logic 502 to be in the replacement mode. Accordingly, redundant element 500 will be used henceforth during operation as the replacement element for defective main array element 3 (the value "3" is stored as a bit pattern in address fuses AF1 and AF0) in the manner described earlier. Typically, the values in address fuses AF1 and AF0 are loaded into respective address latches AL1 and AL0 upon startup to allow the decoding logic 502 to determine the mode of operation (i.e., the inactive mode or the replacement mode) of redundant element 500. Alternatively, it is possible ascertain the mode of operation of redundant element directly from the values stored in the address fuses AF1 and AF0.

Figure 6:
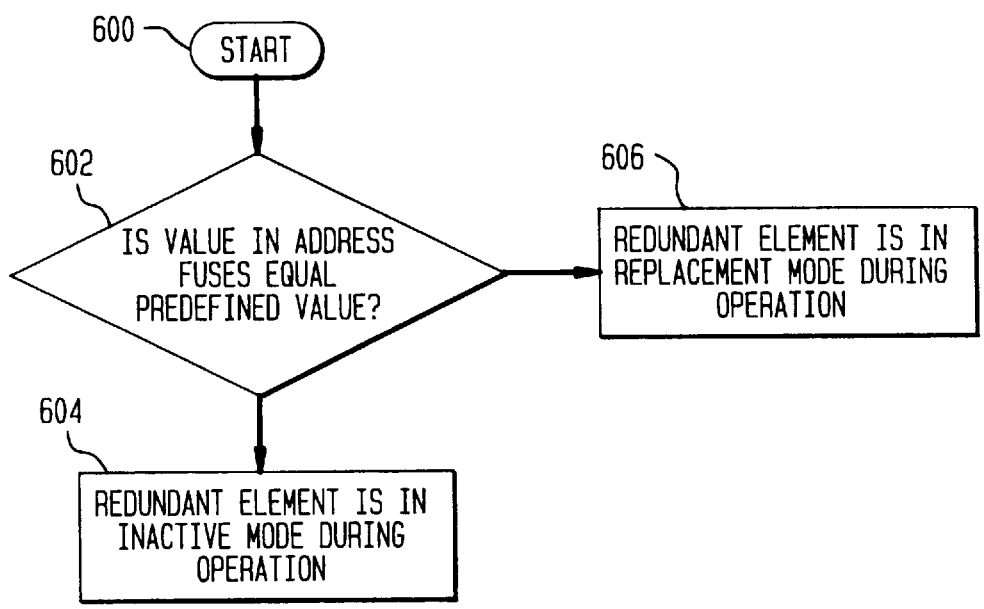
FIG. 6 illustrates, in accordance with one embodiment of the invention, the steps taken by the decoding logic in placing the redundant element of FIG. 5 into the replacement mode.

FIG. 6 illustrates, in accordance with one embodiment of the invention, the steps taken by decoding logic 502 in placing redundant element 500 into the replacement mode. In step 602, decoding logic 502 compares the value stored in the address fuses during manufacturing with the predefined value. Typically but not necessarily, the value stored in the address fuses is first loaded into the respective address latches prior to the comparison. If they match, the redundant element associated with decoding logic 502 is understood to be in the inactive mode during operation (step 604).

On the other hand, if the value stored in the address fuses during manufacturing differs from the predefined value, redundant element 500 is understood to be in the replacement mode during operation. Note that decoding logic 502 understands this without having to set an enable latch EL, as in the case of the embodiment of FIG. 3. Thereafter, redundant element 500 is used in the replacement mode during operation (step 408). The address stored in the address fuses (and loaded into the address latches) specifies which main array element redundant element 500 substitutes during operation.

In the embodiments discussed above, the use of the predefined value to indicate the redundant element's mode of operation precludes that redundant element from replacing one of the main array element (e.g., the main array element whose address matches the predefined value). To solve this problem, it is preferable that overlapping redundant circuit coverage is provided to ensure that all main array elements are replaceable. In accordance with this aspect of the present invention, each memory array is preferably provided with at least two redundant elements (in two redundant circuits). This imposes little, if any, burden on the circuit designer since memory arrays are typically provided with numerous redundant elements anyway to enable the replacement of more than one defective main array element.

Assume, for ease of explanation, that only two redundant elements are provided. The two redundant circuits associated with these two redundant elements preferably have different predefined values. By way of example, if redundant circuit #1 is associated with predefined value 3 and is therefore incapable of providing replacement for the main array element #3, redundant circuit #2 is preferably associated with any predefined value other than 3 (e.g., 2) and can therefore provide replacement coverage should main array element #3 be found to be defective during manufacturing.

The elimination of the enable fuse (and also the enable latch in one embodiment) advantageously permits the memory designer to save space on the chip. Accordingly, it is possible to squeeze additional main array elements and/or redundant elements onto a chip of a given size to increase capacity and/or provide additional replacement capability. As can be appreciated by those skilled in the art, the ability to increase memory capacity without concomitantly increasing chip size is highly advantageous, particularly in areas such as DRAM fabrication where design rules limit the number of devices that can be put on a given die.

In one embodiment, the area that is saved by eliminating the enable fuse (and also the enable latch in one embodiment) may be used by the designer to provide more address bits (i.e., provide more address fuses and address latches) for a given redundant element to increase the redundant element's addressing capability. As can be appreciated by those skilled in the art, the increased addressing capability permits the redundant element to address a larger portion of the main array element, thereby increasing the flexibility with which a given redundant element can be used in replacing defective main array elements.

While this invention has been described in terms of several illustrative embodiments, there are alterations, permutations, and equivalents which fall within the scope of this invention. By way of example, although the disclosures refers mainly to fuses, the term fuse may also encompass anti-fuses. Also, the fuse (or latch) may be set by storing either a value of 0 or 1, as long as this value is properly understood by the decoding logic. It is therefore intended that the following appended claims be interpreted as including all such alterations, permutations, and equivalents as fall within the true spirit and scope of the present invention.

What is claimed is:

1. A method for replacing defective elements of a memory array, comprising:
   forming a first redundant circuit, including,
      forming a first plurality of address fuses, said first plurality of address fuses being configured to specify, when set, an address of one of said defective elements;
      forming a first plurality of address latches, respective ones of said first plurality address latches being coupled with respective ones of said first plurality of address fuses;
      forming a first redundant element; and
      forming a first decoding logic circuit, said first decoding logic being coupled to said first plurality of address latches and said redundant element, said first decoding logic circuit being configured to ascertain during operation of said memory array whether a bit pattern stored in said first plurality of address fuses differs from a first predefined value and to place said first redundant element in a replacement mode if said bit pattern differs from said predefined value, said replacement mode enabling said first redundant element to be used in place of said one of said defective elements during operation.

2. The method of claim 1 further comprising:
   forming a second redundant circuit, including,
      forming a second plurality of address fuses, said second plurality of address fuses being configured to specify, when set, an address of another one of said defective elements;
      forming a second plurality of address latches, respective ones of said second plurality address latches being coupled with respective ones of said second plurality of address fuses;
      forming a second redundant element; and
      forming a second decoding logic circuit, said second decoding logic being coupled to said second plurality of address latches and said second redundant element, said second decoding logic circuit being configured to ascertain during operation of said memory array whether a bit pattern stored in said second plurality of address fuses differs from a second predefined value and to place said second redundant element in said replacement mode if said bit pattern differs from said predefined value, said second predefined value being different from said first predefined value.

3. The method of claim 1 wherein said memory array is a memory array of a dynamic random access memory (DRAM) circuit.

4. The method of claim 3 wherein said providing said first redundant circuit further includes
   forming an enable latch, said enable latch being coupled with said first decoding logic, whereby said first decoding logic places, during said operation, said first redundant element in said replacement mode by setting said enable latch.

5. The method of claim 1 wherein said respective ones of said second plurality of address latches are loaded with values in said respective ones of said second plurality of address fuses during said operation.

6. The method of claim 5 wherein said first decoding logic ascertains said bit pattern stored in said first plurality of address fuses by ascertaining values stored in said first plurality of address latches.

7. The method of claim 1 wherein said first decoding logic places said first redundant element in said replacement mode without employing an enable fuse.

8. The method of claim 1 wherein said first redundant element is placed in said replacement mode without requiring setting of an enable fuse associated with one of said first redundant circuit and said first redundant element during manufacturing.

9. A method for replacing defective elements of a memory array, comprising:
   forming a first redundant circuit, including,
      forming a first plurality of address fuses, said first plurality of address fuses being configured to specify, when set, an address of one of said defective elements;
      forming a first plurality of address latches, respective ones of said first plurality address latches being coupled with respective ones of said first plurality of address fuses;
      forming a first redundant element;
      forming a first decoding logic circuit, said first decoding logic being coupled to said first plurality of address latches and said first redundant element; and
      forming a first enable latch, said first enable latch being coupled with said first decoding logic, said first decoding logic circuit being configured to ascertain during operation of said memory array whether a bit pattern stored in said first plurality of address fuses differs from a first predefined value and to set said first enable latch to place said first redundant element in a replacement mode if said bit pattern differs from said first predefined value.

10. The method of claim 9 wherein said first enable latch is set without employing an enable fuse associated with one of said first redundant circuit and said first redundant element.

11. The method of claim 9 wherein said memory array is a memory array of a dynamic random access memory circuit.

12. The method of claim 9, further comprising:
   forming a second redundant circuit, including,
      forming a second plurality of address fuses, said second plurality of address fuses being configured to specify, when set, an address of another one of said defective elements;
      forming a second plurality of address latches, respective ones of said second plurality address latches being coupled with respective ones of said second plurality of address fuses;
      forming a second redundant element;
      forming a second decoding logic circuit, said second decoding logic being coupled to said second plurality of address latches and said second redundant element; and
      forming a second enable latch, said second enable latch being coupled with said second decoding logic, said second decoding logic circuit being configured to ascertain during operation of said memory array whether a bit pattern stored in said second plurality of address fuses differs from a second predefined value and to set said second enable latch to place said second redundant element in said replacement mode if said bit pattern differs from said second predefined value, said second predefined value being different from said first predefined value.

13. A redundant circuit having a redundant element, said redundant element being configured to replace a defective memory array element, comprising:
   a first plurality of address fuses, said first plurality of address fuses being configured to specify, when set, an address of said defective memory array element;

a first plurality of address latches, respective ones of said first plurality of address latches being coupled to respective ones of said first plurality of address fuses;

a first decoding logic circuit, said first decoding logic circuit being coupled to said first plurality of address latches and said redundant element, said first decoding logic circuit is configured to ascertain whether said redundant element is in an inactive mode or a replacement mode, said redundant element is ascertained by said first decoding logic circuit to be in said inactive mode if said first plurality of address fuses store a value that is equal to a predefined value, said redundant element is ascertained by said first decoding logic circuit to be in said replacement mode if said value stored in said first plurality of address fuses is different from said predefined value, wherein said first decoding logic circuit so ascertains without use of an enable fuse.

14. The redundant circuit of claim 13 further comprising:

a first enable latch coupled to said first decoding logic circuit, said first enable latch being configured to signify, when set, that said redundant element is to be used during operation for replacing said defective memory array element, said first enable latch is set if said value stored in said first plurality of address fuses is ascertained by said first decoding logic circuit to be different from said predefined value.

15. The redundant circuit of claim 13 wherein said defective memory array element represents a memory array element of a dynamic random access memory array.

16. The redundant circuit of claim 13 wherein said redundant element is a redundant row of memory elements.

17. The redundant circuit of claim 13 wherein said redundant element is a redundant column of memory elements.

18. The redundant circuit of claim 13 wherein said address fuses are implemented by anti-fuses.

19. A set of redundant circuits for replacing defective memory elements during manufacturing, comprising:

a first redundant circuit, including:
 a first plurality of address fuses, said first plurality of address fuses being configured to specify, when set, an address of a first one of said defective memory elements,
 a first plurality of address latches, respective ones of said first plurality of address latches being coupled to respective ones of said first plurality of address fuses,
 a first redundant element, and
 a first decoding logic circuit, said first decoding logic circuit being coupled to said first plurality of address latches and said first redundant element, said first decoding logic circuit is configured to ascertain whether said first redundant element is in an inactive mode or a replacement mode, said first redundant element is ascertained by said first decoding logic circuit to be in said inactive mode if said first plurality of address fuses store a first value that is equal to a first predefined value, said first redundant element is ascertained by said first decoding logic circuit to be in said replacement mode if said first value stored in said first plurality of address fuses is different from said first predefined value, wherein said first decoding logic circuit so ascertains without use of an enable fuse; and a second redundant circuit, including:
 a second plurality of address fuses, said second plurality of address fuses being configured to specify, when set, an address of a second one of said defective memory elements,
 a second plurality of address latches, respective ones of said second plurality of address latches being coupled to respective ones of said second plurality of address fuses,
 a second redundant element, and
 a second decoding logic circuit, said second decoding logic circuit being coupled to said second plurality of address latches and said second redundant element, said second decoding logic circuit is configured to ascertain whether said second redundant element is in an inactive mode or a replacement mode, said second redundant element is ascertained by said second decoding logic circuit to be in said inactive mode if said second plurality of address fuses store a second value that is equal to a second predefined value, said second redundant element is ascertained by said second decoding logic circuit to be in said replacement mode if said second value stored in said second plurality of address fuses is different from said second predefined value, said second predefined value being different from said first predefined value, wherein said second decoding logic circuit so ascertains without use of an enable fuse.

20. A set of redundant circuits of claim 19 wherein said defective memory element represents memory elements of a dynamic random access memory array.

* * * * *